(12) United States Patent
Takeichi et al.

(10) Patent No.: US 6,903,463 B1
(45) Date of Patent: Jun. 7, 2005

(54) COG-ASSEMBLY AND CONNECTING MATERIAL TO BE USED THEREIN

(75) Inventors: Motohide Takeichi, Kanuma (JP); Hiroyuki Fujihira, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/659,448

(22) Filed: Sep. 11, 2000

(30) Foreign Application Priority Data

Sep. 14, 1999 (JP) .......................................... 11/261096

(51) Int. Cl.$^7$ ........................ H01L 23/48; H01L 23/52; H01L 29/40; C09K 19/00; B32B 5/16
(52) U.S. Cl. ........................ 257/778; 257/783; 428/1; 428/327; 428/901
(58) Field of Search ........................ 428/1, 327, 901; 257/778, 783

(56) References Cited

U.S. PATENT DOCUMENTS

| 4,680,226 | A | | 7/1987 | Takeda | |
|---|---|---|---|---|---|
| 5,783,713 | A | * | 7/1998 | Schultz et al. | 549/554 |
| 2001/0053448 | A1 | * | 12/2001 | Satsu et al. | 428/447 |

FOREIGN PATENT DOCUMENTS

| EP | 0 914 027 A1 | | 5/1999 |
|---|---|---|---|
| EP | 0 979 854 A1 | | 2/2000 |
| JP | 407197001 | * | 8/1995 |
| JP | 9-169958 | | 6/1997 |
| WO | WO 97/08260 | | 3/1997 |
| WO | WO 98/44067 | | 10/1998 |

* cited by examiner

Primary Examiner—David E. Graybill
(74) Attorney, Agent, or Firm—Flynn, Thiel, Boutell & Tanis, P.C.

(57) ABSTRACT

A chip-on-glass (COG) assembly, in which the electrodes of the semiconductor chips (3) are held in direct connection with the corresponding electrodes on the substrate glass circuit board (1), utilizes a layer (5) of a connecting material for bonding and connecting the semiconductor chip (3) with the substrate board (1). The connecting material can provide a reduced stress concentration at the boundaries between the binder layer (5) and the chip (3) and between the binder layer (5) and the glass board (1), even at higher adhesive strengths, bringing about less deformation, such as warping, of the resulting bonded assembly, even when using a thinner substrate glass board, and provides a superior bonding strength and excellent electroconductive performance. The connecting material is made up of, on the one hand, an adhesive component (6) containing a thermosetting resin and, on the other hand, electroconductive particles (7) and has a characteristic feature that a tensile elongation percentage at 25° C., after having been cured, is at least 5%.

11 Claims, 1 Drawing Sheet

COG-ASSEMBLY AND CONNECTING MATERIAL TO BE USED THEREIN

FIELD OF THE INVENTION

The present invention relates to a chip-on-glass (COG) assembly in which semiconductor chip(s) are bonded and connected to a substrate glass circuit board directly, especially that to be used, for example, for liquid crystal displays, and to a connecting material to be used therein.

DESCRIPTION OF THE RELATED TECHNIQUES

In the past, liquid crystal displays (in the following referred to sometimes as LCD) are constituted by installing a semiconductor package, such as driver IC etc., on a substrate glass circuit board. However, from the recent general trend of fondness for light, thin, short and small articles, it has become a practice of producing liquid crystal displays by using a COG assembly made by assembling the semiconductor chip on a glass substrate board with direct connection thereto. In such a COG assembly, the correspondingly confronting electrodes on the substrate glass circuit board and on the chip are connected together using an anisotropically electroconductive connecting material (referred to in the following sometimes as ACM).

The ACM, which comprises, as principal components, a thermosetting resin, such as an epoxy resin etc., and electroconductive particles, is interposed between the glass circuit board and the semiconductor chip and the interposed layer of ACM is pressed from both sides with heating, whereby the thermosetting resin first melts and then is subjected to curing. Here, the confronting electrodes are brought into pressed frictional contact with the electroconductive particles bridging therebetween to thereby establish a secure electroconductive connection, wherein the heat-set resin mass in the portions around such electrode pairs builds up firm mechanical bonding of the resulting assembly.

The adhesive strength of the ACM onto the substrate glass board or onto the chip is supported by the hardening contraction of the thermosetting resin, which may, however, cause the occurrence of local stress concentration at the interface between the ACM and the substrate glass board or the IC chip. For attaining a high adhesive strength for the ACM, a thermosetting resin capable of building up a cured mass having a high elastic modulus may be chosen, which may bring about, however, greater hardening contraction and higher local stresses at the interfaces. While these local stresses remain as residual stress within the resin layer when the thickness of the substrate glass board is large, they may cause a deformation of the substrate glass board, such as warping or the like, when the glass board is thin.

On the general trend to light, thin, short and small articles in the market, the substrate glass board may be thin sized. Use of a thin glass board may favor the occurrence of deformation of the bonded assembly, resulting in deterioration of the display performance in the case of an LCD.

SUMMARY OF THE INVENTION

An object of the present invention is to provide a COG assembly in which local stress concentration at the interfaces can be relieved, even when a thermosetting resin exhibiting greater adhesive strength is employed to thereby reduce occurrence of deformation, such as warping etc., of the resulting assembly, even when using a thin substrate glass board, with simultaneous attainment of a superior bonding strength and excellent preservation of the electroconductive connection.

Another object of the present invention is to provide a connecting material to be used in assembling COG units, which can provide the COG assembly mentioned above.

The present invention resides in the following COG assembly and connection material:

(1) A connecting material for bonding and connecting a semiconductor chip with the substrate glass board in a COG assembly, in which the electrodes of the semiconductor chip are held in direct connection with the corresponding electrodes on the substrate glass board, the connecting material comprising an adhesive component comprising a thermosetting resin and electroconductive particles, wherein the material has, after having been cured, a tensile elongation percentage at 25° C. of at least 5%.

(2) The connecting material as defined in the above (1), wherein the adhesive component comprises 6–90% by weight of a microparticulate elastomer having an average particle size of 30–300 nm.

(3) The connecting material as defined in the above (1) or (2), wherein it comprises 2–40%, based on the volume of the adhesive component, of the electroconductive particles.

(4) A COG assembly, in which the electrodes of a semiconductor chip are held in direct connection with the corresponding electrodes on the substrate glass board, comprising a layer of a connecting material for bonding and connecting the semiconductor chip with the substrate board, wherein the material comprises an adhesive component comprising a thermosetting resin and electroconductive particles and has, after having been cured, a tensile elongation percentage at 25° C. of at least 5%.

(5) The COG assembly as defined in the above (4), wherein the adhesive component comprises 6–90% by weight of a microparticulate elastomer having an average particle size of 30–300 nm.

(6) The COG assembly as defined in the above (4) or (5), wherein the connecting material comprises 2–40%, based on the volume of the adhesive component, of the electroconductive particles.

(7) The COG assembly as defined in any one of the above (4) to (6), wherein the COG assembly is a liquid crystal display.

DETAILED DESCRIPTION OF THE DISCLOSURE

Figure 1:
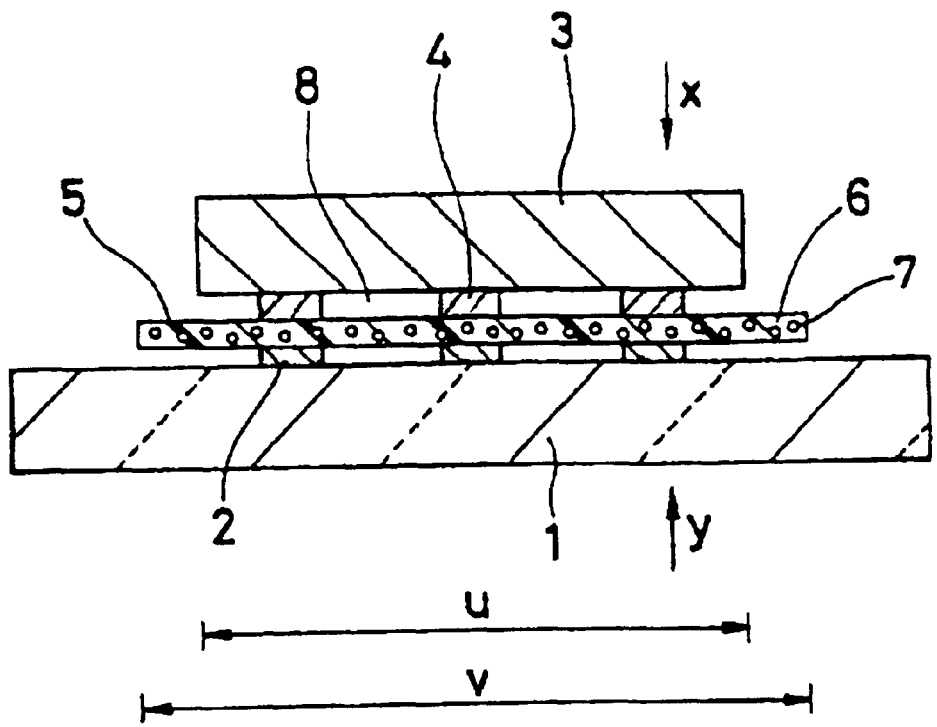
FIG. 1(a) shows an embodiment of the manner of preparing the COG assembly according to the present invention in a schematic sectional illustration.
FIG. 1(b) shows the COG assembly prepared in the manner shown in FIG. 1(a), also in a schematic sectional illustration.
Figure 1:
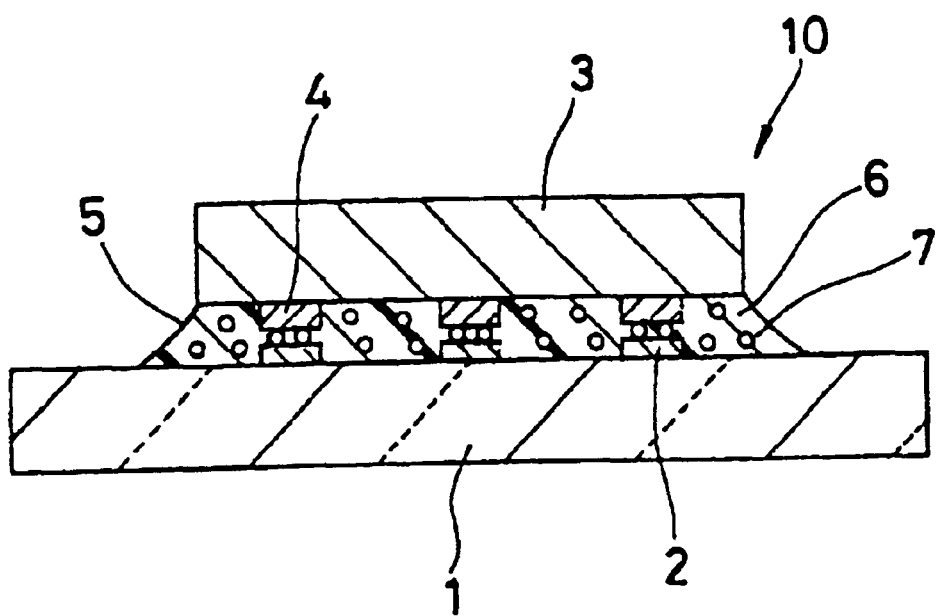

The COG assembly according to the present invention has a structure, in which the electrodes on the semiconductor chip, such as an IC driver, are connected with the corresponding electrodes on the substrate glass circuit board for an LCD, etc., under intermediation with a connecting material. While there is no special limitation as to the thickness of the substrate glass circuit board, the assembly is especially adapted for a substrate glass board of a thickness of not greater than 1.2 mm, in particular not greater than 0.9 mm. The substrate glass circuit board provided with electrodes, such as transparent ones made of indium tin oxide (ITO), in a form of, for example, strips, is bound and connected with the semiconductor chip under intermediation of the interposed connecting material in such a manner that the electrodes on the substrate glass board are in proper opposition to the corresponding counter electrodes of a form of, for example, bumps, of the semiconductor chip. Such a structure of the COG assembly is typical for an LCD, while structures other than this may also be possible.

The connecting material according to the present invention comprises an adhesive component comprising a thermosetting resin and electroconductive particles. The connecting material is interposed between the elements to be connected together and the elements are pressed to each other from both sides so as to cause the electrodes disposed opposingly on the confronting face of each element to be brought into contact with the electroconductive particles bridging between the elements, while holding the thermosetting resin between neighboring electrodes with the electro-conductive particles dispersed therein. In this state, the connecting material is caused to harden in order to attain electrical connection and mechanical bonding at the same time. The connecting material may contain other constituent ingredient(s) so that the tensile elongation percentage of the resulting cured material at 25° C. is not lower than 5%. For this other ingredient(s), a microparticulate elastomer having an average particle size of 30–300 nm may favorably be incorporated.

As the main resin of the thermosetting resin to be incorporated according to the present invention in the connecting material, any kind of resin capable of curing by a concurrent use of a hardening agent under the action of heat or irradiation of a ray, such as a UV ray etc., may be used, for example, epoxy resins, urethane resins, phenol resins, hydroxyl group-containing polyester resins, hydroxyl group-containing acrylic resins and so on. Among them, epoxy resins are most preferable in view of the balance between the participant parameters, such as curing temperature, curing time, storage stability and so on of the resin.

As the epoxy resins, those of the bisphenol type, those of the epoxy-novolak type and those obtained from epoxy compounds having two or more oxirane groups in the molecule may be used. Commercial products of these epoxy resins may also be employed as such.

While the main resin of the thermosetting resin of the connecting material can be subjected to hardening, usually by concurrent use of a hardening agent, it is permissible to dispense with the use of a hardening agent, when a substituent functional group facilitating the hardening reaction is present in the molecule of the main resin. As the hardening agent, there may be used those which can be subjected to the hardening reaction with the main component resin under the influence of heat or irradiation of a ray, for example, imidazoles, amines, acid anhydrides, hydrazides and dicyandiamides, as well as modified products of them. Commercial products may also be employed. For such a hardening agent, preference is given to a latent hardening agent.

A latent hardening agent will not be subjected to a curing reaction during the processing operations and storage at normal temperatures and upon drying at a relatively lower temperature (40–100° C.) but is subjected to a curing reaction under pressure with heating (heat-pressing) at a curing temperature or by the action of heat or irradiation of a ray, such as a UV ray. For such a latent hardening agent, particular preference is given to one in which the above-mentioned hardening agent, such as an imidazole or an amine, is encapsulated in microcapsules, for which commercial products may also be employed. For heat-activated resins, those having a curing initiation temperature of 80–150° C. may favorably be employed.

As the microparticulate elastomer, a microparticulate product of natural or synthetic rubber having a Tg of not higher than 50° C., preferably not higher than 30° C., and a rubbery elasticity at room temperature may be used, for example, a microparticulate product of natural rubber (NR), isoprene rubber (IR), butadiene rubber (BR), styrene/butadiene rubber (SBR), chloroprene rubber (CR) or acrylonitrile/butadiene rubber (NBR).

For this, cross-linked rubber is used, while a thermoplastic elastomer may also be used therefor, so long as its Tg value is not higher than 30° C. The average particle size of the microparticulate elastomer may favorably be in the range of 30 to 300 nm, preferably 50 to 200 nm. Also for the microparticulate elastomer, commercial products may be employed as such.

According to the present invention, it is permissible to incorporate a thermoplastic polymeric substance in the adhesive component, in order to impart to the connecting material an ability of being coated on a substrate or for film forming. For such a thermoplastic polymeric substance, there may be used, for example, a phenoxy resin, a polyester resin or an acrylic resin.

The adhesive component of the connecting material according to the present invention may further contain other additives, such as a coupling agent, antioxidant, surfactant and so on.

As the electroconductive particles to be compounded together with the adhesive component in the connection material according to the present invention, there may be employed, for example, particles of metals, such as solder metal, nickel metal and so on; electrical conductor-coated particles in which the nucleus resin particles are coated with an electroconductive material by plating or the like; and insulator-coated particles in which these electroconductive particles are coated with an insulating resin. The average particle size of these electroconductive particles may be in the range from 1 to 20 $\mu$m, preferably in the range from 3 to 10 $\mu$m.

The adhesive component of the connecting material according to the present invention may contain the thermosetting resin in an amount in the range from 10 to 94% by weight, preferably in the range from 40 to 70% by weight, the thermoplastic resin in an amount of 0–50% by weight, preferably 5–30% by weight, the microparticulate elastomer in an amount in the range from 6 to 90% by weight, preferably from 8 to 30% by weight, and other additive(s) in an amount of 0–10% by weight, preferably 0–5% by weight. The electroconductive particles may be admixed with the adhesive component in an amount in the range from 2 to 40%, preferably from 5 to 25%, based on the volume of the adhesive component.

The connecting material according to the present invention may be provided as a product in a form of a paste or of a film.

For preparing a paste of the connecting material, suitable constituent ingredients may be chosen to form a paste without using any solvent, while, in general, it is practical to formulate the paste by dissolving or dispersing the constituent ingredients in a suitable solvent. As the solvent, there may be used, for example, alcohols, ketones, esters, ethers, phenols, acetal and nitrogen-containing hydrocarbons, among which toluene, MEK, ethyl acetate and cellosolve acetate may be exemplified. The amount of the solvent to be used is, in general, about 20–40% by weight, with respect to the weight of the resin components.

For preparing the connecting material in a form of a film, the above connecting material paste is coated on an exfoliative sheet in a layer, whereupon the solvent of the paste is volatilized to build up a film.

The connecting material according to the present invention may favorably be formulated from the above-mentioned constituent ingredients so that the resulting connecting material after having been cured has a tensile elongation percentage at 25° C. of at least 5%, preferably in the range from 6 to 20%, by selecting suitable kinds and proportions of the constituent ingredients, whereby the occurrence of warping of the resulting COG assembly can be minimized, even if a thin glass board is used. In addition, the bonding strength and the reliability of the secured electroconductive connection of the resulting COG assembly can be increased by selecting the constituent ingredients in such a way that the cured connecting material will have an elastic modulus at 30° C. in the range from 0.9 to 3 Gpa, preferably in the range from 0.9 to 2 Gpa, and a Tg of not lower than 100° C., preferably in the range from 110 to 160° C.

The specific procedures for the determination of the above-mentioned characteristic properties are as follows:

Tensile elongation percentage is determined by the method according to JIS K-7161.

Elastic modulus is determined by the DMA Method.

Tg is determined as the temperature at the peak of tan δ on the determination of the elastic modulus.

The connecting material according to the present invention is interposed between two elements to be connected together, namely, a substrate glass circuit board and a semiconductor chip, each provided on the confronting face with a plurality of electrodes, while holding these elements in a posture in which the electrodes on the confronting face of each of the elements are in a correspondingly confronting relationship with each other, whereupon the elements are heat-pressed by pressing them together from both sides with heating to cause the thermosetting resin to be cured to build up a solid assembly. In the case of using a paste of the connecting material, it is coated on one of the elements over a region encompassing the electrodes, whereupon the other one of the elements is placed on the so-coated face of said one of the elements after drying the coated layer or without drying it in such a position that the correspondingly confronting electrodes are in proper opposition to each other, followed by heat pressing of the assemblage to cause curing of the resin. In the case of using a film of the connecting material, it is interposed between the two elements to be connected together, followed by heat pressing of the assemblage to cause curing of the resin. The curing may be caused not only by heating but also by the action of irradiation of a ray, such as a UV ray.

In the connecting step described above, by pressing the connecting material interposed between the two elements to be connected together with heating, the resin in the connecting material first melts and then is expelled from the interspace between the opposing electrodes aside to the vacant space where the electrode is absent while leaving the electroconductive particles within the interspace between the opposing electrodes, until these electroconductive particles are caught by the opposing electrodes on the elements to bridge therebetween to build up an electroconductive frictional contact of them, whereupon the resin becomes cured within the heat-pressed interspace to build up mechanical bonding of the semiconductor chip and the glass circuit board. By using the connecting material according to the present invention, a secured electroconductive connection between the electrodes and a firm mechanical bonding of the elements to be bonded can be attained, even when the electrode pitch is narrow and the surface area and the interval of the electrodes are small.

The COG assembly in which a semiconductor chip is installed on a substrate glass circuit board does not suffer from local stress concentration at the interfaces due to the curing contraction of the resin, since the cured connecting material is permitted to elongate a considerable extent. As a result, the occurrence of deformation, such as warping or the like, is excluded and any deterioration of image display performance in an application for an LCD will not be encountered. Moreover, an excellent mechanical bonding and a superior reliability in the electroconductive connection can be attained and the occurrence of defects in the electrical conductivity at the junction between the electrodes is avoided for long term.

As described above, it is possible according to the present invention, to obtain a COG assembly in which the occurrence of local concentration of internal stress at the interfaces can be relieved, even when the bonding layer reveals a higher adhesive strength to thereby suppress the occurrence of deformation, such as warping or the like, even when using a thin substrate glass board, on the one hand, and to obtain a connecting material which is superior both in the adhesive strength and reliability of electroconductive connection of electrodes, on the other hand, due to the inventive feature that the connecting material comprises a thermosetting resin and electroconductive particles and has, after having been cured, a tensile elongation percentage of at least 5%.

THE BEST MODE FOR EMBODYING THE INVENTION

Below, the present invention will further be described by way of embodiments with reference to the drawings appended.

An embodiment of a COG assembly is shown in a schematic illustration in FIGS. 1(*a*) and 1(*b*) showing the manner of assemblage and the resulting COG assembly, respectively, in which, on the substrate glass circuit board 1 having ITO layers 2 as the electrodes, a semiconductor chip 3 of, for example, a driver IC, having bumps 4 as the electrodes is installed. The electrodes, namely, the ITO layers 2 and the bumps 4 are each disposed at such a position as to confront to each other to constitute each confronting electrode pair. The connecting material 5 in a form of a film is interposed between the glass board 1 and the semiconductor chip 3, while holding them in such a relative position that each electrode pair is in the proper confronting posture to build up the assembly. The connecting material 5 is composed of an adhesive component 6 comprising a resinous constituent containing a thermosetting resin and a microparticulate elastomer and electroconductive particles 7. When the connecting material in the form of paste is used, it is coated on the substrate glass board 1.

On assembling the chip on the glass circuit board, the connecting material 5 is placed on the glass circuit board 1 over an extent covering the region v which is greater than the region u to be covered by the semiconductor chip 3, as shown in FIG. 1(a), whereon the semiconductor chip 3 is put in such a posture that the bumps 4 thereof confront the glass circuit board 1 so as to settle each bump 4 in a proper confronting relationship with the corresponding ITO layer 2. Then, the glass circuit board and the chip are pressed onto each other from both sides as indicated by the arrows x and y while heating the connecting material 5. The adhesive component 6 in the connecting material 5 is hereby melted at first and the connecting material 5 is expelled aside into the free interstitial space 8 between the glass circuit board 1 and the semiconductor chip 3, where no electrode is disposed, to fill up the space 8, before the thermosetting resin is heat-set to build up a solid COG assembly 10, as shown in FIG. 1(b).

In the COG assembly 10, the electroconductive particles 7 are held between each pair of bump 4 and the ITO layer 2 while being pressed by them and, due to the hardening contraction of the adhesive component 6, the pressing is facilitated to establish a secure frictional contact with each other and with the electrodes to build up a reliable electroconductive connection. Due to the incorporation of the connecting material 5 having the characteristic features described above, a superior bonding strength and a reliable electrical connection can be attained and, in addition, the occurrence of local stress concentration at the bonding interfaces by hardening contraction is avoided due to the large tensile elongation percentage of the cured connecting material. Therefore, no deformation, such as warping, will appear in the glass circuit board in the region u or v, so that no deterioration in the image display will occur when used in an LCD.

EXAMPLES

Below, the present invention will further be described by way of embodiments with reference to the drawings appended.

Examples 1 to 4 and Comparative Examples 1 to 3
Preparation of the Connecting Material A composite paste of connecting material was prepared by blending an epoxy resin A (a product of Dainippon Ink & Chemicals Inc., with the trade name 4032 D) and an epoxy resin B (a product of Tohto Kasei Co., Ltd., with the trade name YD 128) as the thermosetting resin, together with a hardening agent based on imidazole (a product of Asahi Chemical Industry Co., Ltd. with the trade name HX-3941 HP), a microparticulate polybutadiene rubber (a product of Kuraray Co., Ltd., with an average particle size of 80 nm) as the microparticulate elastomer, an acrylic resin (a product of Fujikura Kasei Co., Ltd. with the trade name SG 80, with a Tg of −25° C.) as the thermoplastic resin having a Tg of not higher than 50° C., a phenoxy resin (a product of Tohto Kasei Co., Ltd. with the trade name YP 50, with a Tg of 80° C.) as the thermoplastic resin having a Tg of higher than 50° C., a commercial product of electrical conductor-coated particles (a product of Nippon Chemical Industrial Co., Ltd. with the trade name EH 20GNR, with an average particle size of 5 $\mu$m) as the electroconductive particles and toluene as the solvent, in a proportion as given in Table 1. The so-prepared paste was coated on an exfoliative film made of polyethylene terephthalate (PET), which had been subjected to an exfoliative surface treatment, up to a thickness which would result in a dry layer thickness of 40 $\mu$m, whereupon the coating layer was placed in a hot air circulating furnace at 80° C. for 5 minutes, whereby a connecting material in a form of a film was obtained.

Material Property Test

For determining the elastic modulus, the film coated with the uncured connecting material was cut into ribbons of a size of 6 cm×0.2 cm, which were then subjected to curing at 180° C. for 15 minutes, whereupon the cured layer of the connecting material was peeled off from PET film for use as the testing sample. For the testing, VIBRON DDV 01 FP (trade name) of the firm Orientec was used and the determination was carried out under the condition of a vibration frequency of 11 Hz, a temperature elevation rate of 3° C. per minute and a chuck-to-chuck distance of 5 cm.

The temperature at the peak of tan δ in the testing of the elastic modulus was determined as the Tg.

Tensile Test

For the tensile test, the film coated with the uncured connecting material was cut into ribbons of a size of 1 cm×15 cm using a cutter knife, which were then subjected to curing at 180° C. for 15 minutes, whereupon the cured layer of the connecting material was peeled off from the film for use as the testing sample. For the testing, tensile tester AUTOGRAPH AGS-H and a video elongation meter of Model DVE-200 of Shimadzu Corp. were used and the determination of the tensile elongation percentage was carried out under the condition of a drawing speed of 1 mm per minute, a chuck-to-chuck distance of 10 cm, a calibration gauge length of 5 cm and a testing temperature of 23° C.

Connection Test

The bump electrodes of an IC chip (made of silicon, with a size of 2 mm×20 mm with a thickness of 0.55 mm, with gold-plated bumps each having a bump thickness of 20 $\mu$m disposed at an interval of 80 $\mu$m) were connected to corresponding electrodes on a 0.7 mm thick glass circuit board (a product of Corning with the trade name 1737 F, with a size of 50 mm×10 mm) under intermediation by the connecting material of a form of film prepared as above. On the glass circuit board, ITO layers are each disposed at a position confronting to a corresponding bump of the IC chip. On the glass circuit board, the IC chip was placed under intermediation with the connecting material film in such a manner that the bump and the ITO layer in each corresponding pair are in proper opposition to each other, as shown in FIG. 1(a), whereupon the resulting assemblage was subjected to heat pressing under a condition of 200° C.×10 seconds×98 N (10 kgf) pressing force to obtain a COG assembly as shown in FIG. 1(b).

For this connection assembly, a 90° peeling strength was determined in accordance with the testing method of JIS K-6853 (Test for Peeling Strength of Adhesives) as the bonding strength.

For the reliability of the electroconductive connection, the connection resistance was determined by a so-called tetraterminal-method in which the connection resistance was determined initially and after standing for 1,000 hours under a condition of 85° C. and 85% relative humidity, from which the average was taken from determinations at 40 different portions of the detecting terminals.

Determination of Amplitude of Warping

For the COG assembly, the amplitude of warping of the glass surface after the heat pressing was detected using a surface roughness meter (supplied from the firm Kozaka Kenkyujo with the trade name SE-3H) of a probe needle contacting type by scanning the glass surface from beneath the glass board 1 of the COG assembly 10 as shown in FIG. 1(b) over the region of u shown in FIG. 1(a).

The results are recited in Table 1.

TABLE 1

|  | Example | | | | Comparative Example | | |
| --- | --- | --- | --- | --- | --- | --- | --- |
|  | 1 | 2 | 3 | 4 | 1 | 2 | 3 |
| Adhesive component (wt. part) | | | | | | | |
| Epoxy resin A | 10 | — | — | 30 | 30 | 25 | 20 |
| Epoxy resin B | 10 | 30 | 28 | — | — | — | — |
| Hardening agent | 40 | 40 | 40 | 40 | 40 | 40 | 40 |
| Micropartic. rubber | 10 | 10 | 12 | 10 | — | 5 | — |
| Acrylic resin | — | — | — | — | — | — | 10 |
| Phenoxy resin | 30 | 20 | 20 | 30 | 30 | 30 | 20 |
| Electrocond. particles[1] | 12 | 12 | 12 | 10 | 12 | 12 | 12 |
| Material Property | | | | | | | |
| Elongat. percentage (%) | 6.8 | 7.2 | 12.1 | 6.1 | 2.5 | 3.6 | 3.7 |
| Tg (° C.) | 128 | 121 | 121 | 139 | 142 | 128 | 134 |
| Elastic modulus (GPa) | 1.9 | 1.1 | 0.9 | 2.4 | 2.9 | 1.9 | 2.1 |
| Test Results | | | | | | | |
| Amplitude of warp. ($\mu$m) | 6.9 | 5.8 | 4.9 | 6.8 | 12.2 | 10.1 | 9.5 |
| Adhes. streng. (kgf/4 mm$^2$) | 4 | 5 | 6 | 4 | 2 | 2 | 3 |
| Initial resistance ($\Omega$) | 13 | 13 | 13 | 13 | 13 | 13 | 13 |
| Resist. aft. 1000 h ($\Omega$) | 16 | 17 | 19 | 16 | 23 | 40 | 26 |

Note
[1]In percent, based on the volume of the adhesive component.

From the results given in Table 1, it is seen that the connecting materials of Examples 1 to 4 show smaller amplitudes of warping with superior bonding performances and also superior results as to the reliability of the electroconductive connection. In contrast thereto, Comparative Examples 1 to 3, in which the features prescribed by the present invention are not satisfied, show a greater amplitude of warping with an inferior bonding strength and inferior electroconductive connection performances.

What is claimed is:

1. A connecting material for bonding and connecting a semiconductor chip with a substrate glass board and forming a COG assembly in which electrodes provided on the semiconductor chip are held in direct connection with corresponding electrodes provided on the substrate glass board, said connecting material having a tensile elongation percentage at 25° C. of at least 5%, after being cured, and comprising:
an adhesive component comprising
10–94% by weight of an epoxy resin,
5–30% by weight of a thermoplastic polymeric substance and
6–90 wt. % of a microparticulate elastomer product selected from the group consisting of natural rubber, isoprene rubber, butadiene rubber, styrene/butadiene rubber, chloroprene rubber and acrylonitrile/butadiene rubber having an average particle size of 30–300 nm and
electroconductive particles.

2. The connecting material as claimed in claim 1, wherein it comprises 2–40%, based on the volume of the adhesive component, of the electro-conductive particles.

3. The connecting material of claim 1, wherein the microparticulate elastomer has an average particle size of 50–200 nm.

4. The connecting material of claim 1, wherein the electroconductive particles have an average particle size of from 1–20 $\mu$m.

5. The connecting material of claim 1, wherein the cured connecting material has an elastic modulus of from 0.9–3 GPa at 30° C. and a Tg of from 110–160° C.

6. A COG assembly comprising a semiconductor chip having electrodes provided thereon and a substrate glass board having electrodes provided thereon corresponding to the electrodes provided on the semiconductor chip, the electrodes provided on the semiconductor chip being held in direct connection with the corresponding electrodes provided on the substrate glass board by a connecting material, the connecting material having a tensile elongation percentage of at least 5% at 25° C., after being cured, and comprising an adhesive component comprising 10–94% by weight of an epoxy resin, 5–30% by weight of a thermoplastic polymeric substance, 6–90 wt. % of a microparticulate elastomer product selected from the group consisting of natural rubber, isoprene rubber, butadiene rubber, styrene/butadiene rubber, chloroprene rubber and acrylonitrile/butadiene rubber having an average particle size of 30–300 nm and electroconductive particles.

7. The COG assembly as claimed in claim 6, wherein the connecting material comprises 2–40%, based on the volume of the adhesive component, of the electroconductive particles.

8. The COG assembly as claimed in claim 6, wherein the COG assembly is a liquid crystal display.

9. The COG assembly of claim 6, wherein the microparticulate elastomer has an average particle size of 50–200 nm.

10. The COG assembly of claim 6, wherein the electroconductive particles have an average particle size of from 1–20 $\mu$m.

11. The COG assembly of claim 6, wherein the cured connecting material has an elastic modulus of from 0.9–3 GPa at 30° C. and a Tg of from 110–160° C.

* * * * *